United States Patent [19]

Chin et al.

[11] Patent Number: 4,754,433
[45] Date of Patent: Jun. 28, 1988

[54] DYNAMIC RAM HAVING MULTIPLEXED TWIN I/O LINE PAIRS

[75] Inventors: Daeje Chin, Los Altos, Calif.; Wei Hwang, Armonk; Nicky C. Lu, Yorktown Heights, both of N.Y.

[73] Assignee: IBM Corporation, Armonk, N.Y.

[21] Appl. No.: 908,440

[22] Filed: Sep. 16, 1986

[51] Int. Cl.⁴ .............................................. G11C 7/00
[52] U.S. Cl. .................................... 365/189; 365/203; 365/230
[58] Field of Search ............... 365/189, 203, 230, 233, 365/235

[56] References Cited

U.S. PATENT DOCUMENTS 4,672,587   6/1987   Geiger et al. ........................ 365/230

Primary Examiner—Joseph A. Popek
Attorney, Agent, or Firm—Perman & Green

[57] ABSTRACT

A dynamic random access memory (DRAM) is comprised of a first and a second input/output (I/O) bus, a first and a second I/O sense amplifier, and a first and a second I/O bus precharge circuit. A control circuit is responsive to the state of a mode control signal for enabling the operation of the I/O buses and the precharge circuits such that in one mode of operation the DRAM operates in a conventional single bit per CAS cycle page mode. In a second mode of operation a high speed dual bit per CAS cycle page mode is achieved, wherein the I/O buses are alternately enabled, one being enabled when CAS is asserted and the other being enabled when CAS is deasserted. The dual bit mode of operation provides also for precharging the I/O bus which is not enabled during the period when the other bus is enabled. Thus, in the dual bit mode of operation data transfers to or from the DRAM occur both when CAS is asserted and also when CAS is deasserted, thereby doubling the data transfer rate over that of the conventional page mode of operation.

11 Claims, 2 Drawing Sheets

DYNAMIC RAM HAVING MULTIPLEXED TWIN I/O LINE PAIRS

BACKGROUND OF THE INVENTION

This invention relates to a semiconductor memory and, more particularly, to a dynamic random access memory (DRAM) having multiplexed twin I/O line pairs for improved page mode speed performance.

DRAMS are extensively used throughout the computer industry as data storage devices. Their relatively small size, high speed of operation and high storage density render them particularly suitable for the construction of computer memory systems.

In general, a DRAM is comprised of a two dimensional array of binary storage cells organized by rows and columns wherein the presence or absence of a stored charge is indicative of a bit of data. In order to select a desired one of the storage cells for the reading or writing of data therein a plurality of address inputs are provided to the DRAM. To minimize the number of input connections to the DRAM, and hence the package size and cost, the address inputs are typically multiplexed. In operation, the least significant address bits are first applied to their respective address inputs followed by the assertion of a row address strobe (RAS) signal. RAS being asserted causes the row address of the storage array to be latched within the DRAM. The most significant address inputs are next applied followed by the assertion of a column address strobe (CAS) signal. The particular combination of the row and column addresses thus applied is decoded within the DRAM by row address and column address decoder circuitry to select one of the binary storage cells for reading or writing and, also to control the operation of the DRAM.

As may be appreciated, depending on the particular topology of the two dimensional storage array, the number of address inputs and other factors a variety of different decoder circuits may be employed. Illustrative of some of these decoder circuits of the prior art are the following U.S. Patents, namely, two U.S. Pat. Nos. 4,156,938 and 4,477,739 to Proelsting et al, two U.S. Pat. Nos. 4,200,917 and 4,309,629 to Moench, a U.S. Pat. No. 4,309,629 to Kamuro, and a U.S. Pat. No. 4,477,884 to Iwahashi.

Although the foregoing decoder circuits may be suitable for their intended applications, a problem arises when it is desired to perform multiple data accesses to the DRAM in a high speed manner. Referred to as a page mode of operation, this type of access typically requires maintaining RAS in an asserted state to thereby provide a row address to the array. While RAS is so asserted a plurality of column addresses and associated CAS signals are sequentially provided to the DRAM. Thus, a particular row is selected and a plurality of columns within that row are sequentially accessed.

Currently known DRAMS have one I/O line pair, or bus, for connecting the outputs of a plurality of storage array sense amplifiers to an I/O line sense amplifier during the time that CAS is asserted. The use of one I/O line pair requires that some minimum interval of time be allowed between successive assertions of CAS in order to allow for the proper precharging of the I/O line pair. Inasmuch as the I/O line sense amplifier is essentially a differential or cross-coupled type of amplifier, such precharging is required to equalize the voltage potential between the two lines of the I/O line pair, thus ensuring the proper operation of the sense amplifier for sensing the state of a data bit appearing on the I/O line pair. This requirement of precharging the single I/O line pair between successive assertions of CAS results in a limitation of the number of bits which may be read from or stored within the DRAM during a given interval of time.

SUMMARY OF THE INVENTION

The foregoing problem is overcome and other advantages are provided by a memory device having one set of circuitry operable for the storage and retrieval of data and a precharge means operable for precharging the circuitry and, in addition, a second set of circuitry similarly operable for the storage and retrieval of data and a second precharge means for precharging the additional circuitry. A decoder, or control circuit, is also provided for selecting either the first or the second set of circuitry for the storage and retrieval of data while simultaneously precharging the other set.

In an illustrative embodiment a DRAM comprises two I/O line pairs, or buses, which provide for a dual bit page mode type of access which is substantially twice as fast as that in a conventional DRAM having a single I/O line pair.

In the illustrative embodiment, a decoder, or control, circuit is operable for providing two precharge CAS (PCAS) signals which are generated from CAS, each PCAS signal controlling an I/O bus and an associated precharge circuit. The outputs from a plurality of bit line sense amplifiers are alternately connected to the first and second I/O bus. The successive assertion and deassertion, or toggling, of CAS during a page mode access results in the first I/O bus being active when CAS is asserted and the second I/O bus being inactive, thereby being precharged. Similarly, when CAS is deasserted, the first I/O line pair is precharged and the second I/O line pair is active. The decoder circuit is responsive to the state of a control signal to operate in a dual bit per CAS cycle mode or in a conventional single bit per CAS cycle mode.

In accordance with a method of the invention, a first and a second I/O bus are provided for coupling a first and a second plurality of bit line sense amplifiers to a first and a second I/O sense amplifier. By controlling the enabling of an individual sense amplifier and its corresponding I/O sense amplifier data is transferred over the associated I/O bus. Simultaneously, the precharge circuit associated with the other I/O bus is enabled for precharging that I/O bus. Typically, one of the I/O buses is transferring data while CAS is asserted and the other bus is transferring data when CAS is deasserted. Thus, the use of the dual bit mode of the invention provides two data bits for each CAS cycle as opposed to only one data bit in the conventional, single bit page mode. Thus, a data transfer rate which is substantially twice as fast as a conventional DRAM is realized.

BRIEF DESCRIPTION OF THE DRAWINGS

The foregoing aspects and other features of the invention are explained in the following description, taken in connection with the accompanying drawing wherein.

DETAILED DESCRIPTION

In the following description a signal name followed by an asterisk (*) is considered to be asserted, or true, when the signal is at a logic zero state, or low. Conversely, a signal name not followed by an asterisk is considered to be asserted when the signal is at a logic one state, or high. Also, a high applied to the gate electrode of a metal-oxide-semiconductor field effect transistor (MOSFET) of n-type conductivity is operable to activate, or turn on the transistor while a low applied to the gate is operable to turn off the transistor. Conversely, a low applied to the gate of a MOSFET having p-type conductivity is operable to turn on the MOSFET while a high applied to the gate is operable to turn off the transistor.

Figure 1:
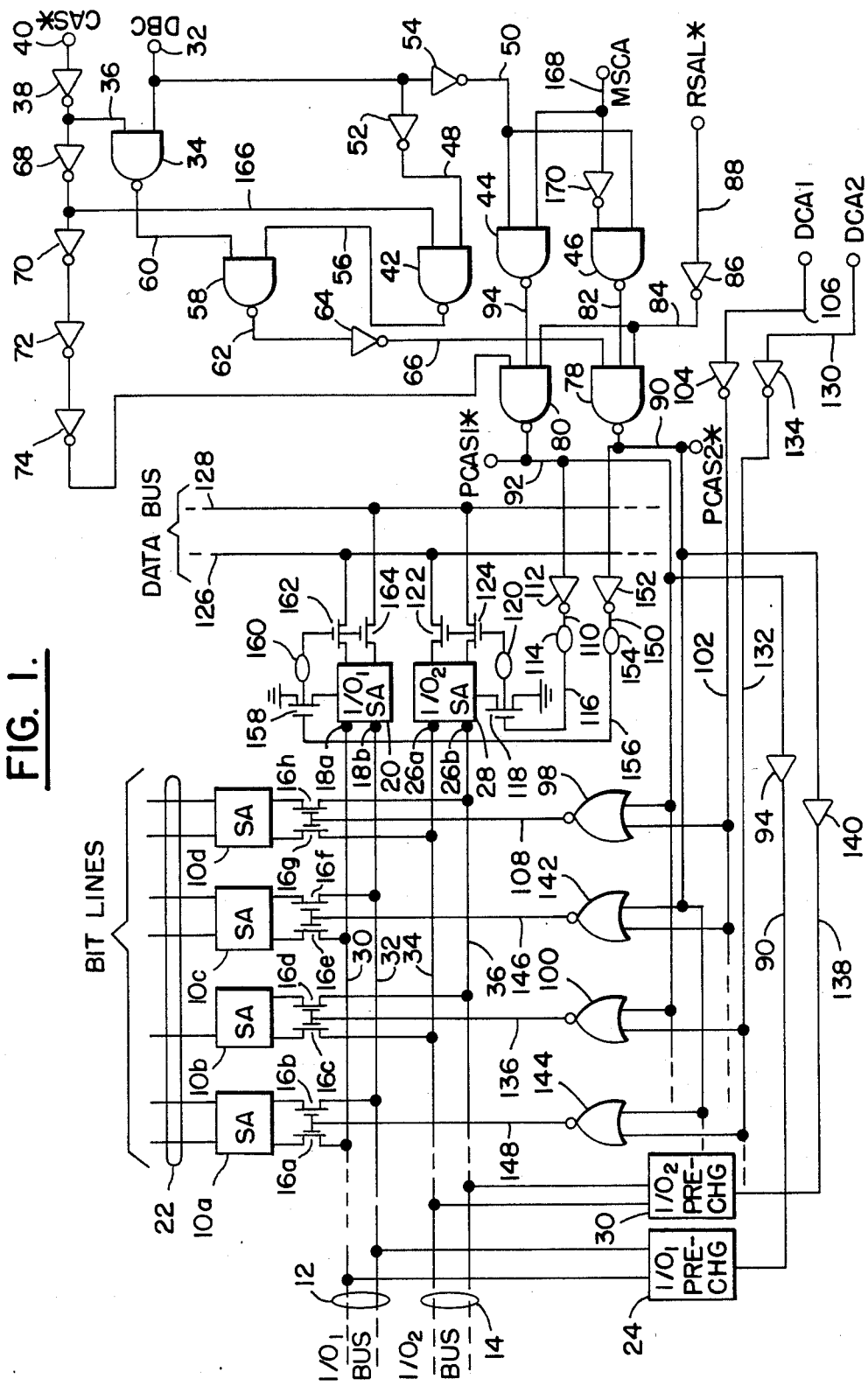
FIG. 1 schematically shows a portion of DRAM having an embodiment of the invention.

With reference to FIG. 1, a portion of a dynamic random access memory (DRAM) is shown to be comprised of a plurality of bit line sense amplifiers (SA) 10a, 10b, 10c and 10d. In accordance with the invention, SA's 10 are alternately connected to a first and a second input/output (I/O) line pair, or bus I/O$_1$ BUS 12 and I/O$_2$ BUS 14 respectively, through a plurality of n-type MOSFET switches 16a through 16h. Although the number of SA's 10 is shown as four, it is understood that the actual number will be dependent on the size of the DRAM data storage array. For example, if the array has a size of 16,384 storage elements, 128 SA's would be required. I/O$_1$ BUS 12 is further connected to a pair of input terminals 18a and 18b of a differential or cross-coupled type of first I/O sense amplifier I/O$_1$ SA 20. I/O$_1$ SA 20 is operable to sense a difference in potential between each line of the I/O$_1$ BUS 12, the difference in potential being due to one of the SA's 10a or 10c driving the lines 12 in response to a data bit present on a plurality of associated bit line inputs 22. In order that the potential between lines 30 and 32 of I/O$_1$ BUS 12 be substantially equalized before being driven by SA 10a or 10c a first precharge circuit (I/O$_1$ PRECHG) 24 is provided. I/O$_1$ PRECHG 24 is typically comprised of a pair of p-type MOSFETS (not shown) each having a source electrode connected to a positive voltage potential, a drain electrode connected to a respective one of the lines of I/O$_1$ BUS 12, and a gate electrode connected to an enabling precharge signal.

I/O$_2$ BUS 14 is similarly connected to a pair of input terminals 26a and 26b of a second I/O sense amplifier (I/O$_2$ SA) 28. In addition, each line 34 and 36 of I/O BUS 14 is connected to a second precharge circuit (I/O$_2$ PRECHG) 30, the operation of which is similar to that of I/O$_1$ PRECHG 24.

In order to control the operation of the aforementioned I/O buses, sense amplifiers and precharge circuits the invention provides a decoder circuit, also referred to herein as a control circuit. The operation of the control circuit will now be described.

In accordance with the invention, the dual bit per CAS cycle page mode of operation is enabled by the assertion of a dual bit control (DBC) 32 signal. DBC 32 being high provides an enabling input to NAND gate 34, the other enabling input 36 being provided through inverter 38 during the time that CAS* 40 is asserted, or low. The assertion of DBC 32 further disables NAND gates 42, 44 and 46 via the outputs 48 and 50 of inverters 52 and 54, respectively. The disabling of gates 42, 44 and 46 is required to enable the dual bit mode and disable the conventional single bit mode of operation, the operation of which will be discussed in detail hereinafter. During the time that DBC 32 is asserted, gate 42 will provide an enabling input 56 to NAND gate 58, a second input 60 to gate 58 being provided by gate 34. The signal appearing at input 60 will be indicative of the state of CAS* 40 because of the double inversion provided by inverter 38 and gate 34. Thus, the output 62 of gate 58 will be the inversion of CAS* 40, which output 62 is inverted once more by inverter 64 such that the output 66 of inverter 64 is in phase with CAS* 40, that is, when CAS* 40 is low output 66 will be low.

The output 36 of inverter 38 is also provided as an input to the inverter chain comprised of inverters 68, 70, 72 and 74 such that the output 76 of inverter 74 is 180 degrees out of phase with output 66, that is, when output 66 is low output 76 will be high. Thus the output 76 is also 180 degrees out of phase with CAS* 40. The use of multiple inverters in the aforementioned inverter chain is to substantially equalize the signal delays due to circuit propagation delays experienced by both outputs 66 and 76.

Figure 2:
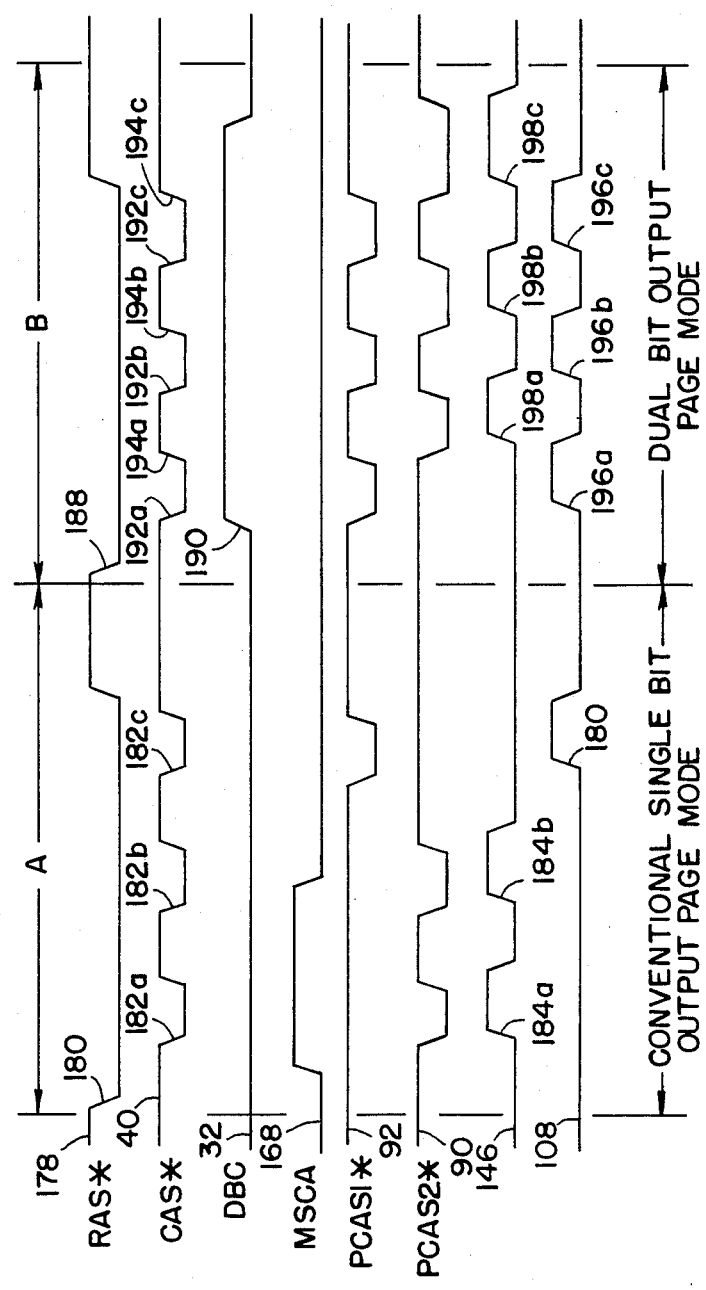
FIG. 2 illustrates timing waveforms useful in understanding the two types of page mode operation made possible by the invention.

Outputs 66 and 76 are applied as inputs to NAND gates 78 and 80, respectively. Gates 78 has as a second input the output 82 of gate 46, which output 82 is high during the dual bit mode of operation. Gate 78 further has as an input the output 84 of inverter 86. The input to inverter 86 is the row sense amp latch (RSAL*) 88 signal. RSAL* 88 is asserted by other circuitry (not shown) in the DRAM row circuits soon after the row address strobe (RAS*) 178 signal is asserted (FIG. 2). The assertion of RSAL* 88 indicates that a row sense amp latching action has been completed and that the DRAM is ready to respond to the assertion of CAS* 40.

Thus, it may be seen that the output signal Precharge CAS2 (PCAS2*) 90 of gate 78 is substantially the inversion of CAS* 40. The output signal Precharge CAS1 (PCAS1*) 92 of gate 80 is substantially identical to CAS* 40, gate 80 being enabled by output 84 and also, in the dual bit mode, by the output of gate 44.

In operation, when CAS* 40 is asserted during the dual bit mode of operation the low on PCAS1* 92 is buffered by buffer 94 to provide a low on output 96 for enabling the operation of I/O$_1$ PRECHG 24, thereby precharging I/O$_1$ BUS 12. Simultaneously, the low on PCAS1* 92 is applied as an input to NOR gates 98, 100 and other, unillustrated NOR gates, each of which has an output for controlling the MOSFET switches 16 which couple alternate SA's 10 to I/O$_2$ BUS 14. A second input to NOR gate 98 is provided by the output 102 of inverter 104. The input to inverter 104 is a first decoded column address (DCA1) 106 signal provided by column address decoder circuitry (not shown). In operation, DCA1 106 will be asserted for a first specific combination of column addresses, thereby selecting a specific column of the memory storage array. The inversion of DCA1 106 appearing on output 102, in conjunction with PCAS1* 92 being low, will cause the output 108 of NOR 98 to be high, thereby enabling MOSFET switches 16g and 16h to couple the storage array column connected to SA 10d to I/O$_2$ BUS 14. PCAS1* 92 being low will further cause the output 110 of inverter 112 to be high. Output 110 is delayed by a delay element 114 a sufficient amount of time to permit the switches 16g and 16h to couple SA 10d to I/O$_2$ BUS 14, afterwhich the high appears on line 116 and activates transistor 118 to latch the state of the I/O$_2$ BUS 14. A further delay is introduced by a delay element 120, afterwhich switches 122 and 124 are enabled to couple I/O SA$_2$ 28 to the DRAM data bus lines 126 and 128.

During a data storage, or write cycle, the data bit to be written is driven into the data bus lines 126 and 128 by a pair of well known write drivers (not shown), the direction of data flow thereafter being through switches 122 and 124, through the I/O$_2$ SA 28 and onto the I/O$_2$ BUS 14. Depending upon which of the plurality of switches 16 are selectively enabled, the data will be applied to a storage cell for storage. Thus the use of the invention is equally advantageous for performing both read and write high speed, or pipelined, transfers.

As may be appreciated, delay elements 114 and 120 may be comprised of a selected number of gates, such as two serially connected inverters, such that the summation of the propagation delays through the individual gates provides a desired amount of signal delay.

The signal DCA$_2$ 130 is another output of the column address decoder circuitry (not shown) and is high for a second specific combination of column address signals.

DCA$_2$ 130 being asserted causes the output 132 of inverter 134 to provide an enabling signal to NOR gate 100 which, in conjunction with PCAS1* 92 being low, enables, via output 136, the switches 16c and 16d for coupling storage array column connected to SA 10b to I/O$_2$ BUS 14.

It should be realized that there will be $2^n$ number of DCA signals (DCA$_1$–DCA$_n$) where n equals the number of column address signals less one, the remaining column address signal being the most significant column address (MSCA) 168 which is applied to gates 44 and 46 for selectively enabling one of the BUSES 12 and 14 in the single bit mode of operation, as will be described in detail below.

The operation of PCAS2* 90 is similar to that of PCAS1* 92, that is, it provides for enabling the operation of one I/O BUS while simultaneously precharging the other I/O BUS. As may be seen, PCAS2* 90 being low causes the output 138 of buffer 140 to be low, thereby enabling I/O$_2$ PRECHG 30 to precharge I/O$_2$ BUS 14. Simultaneously, NOR gates 142 and 144 have one input enabled, the other input being the inversion of one of the DCA signals. Depending on whether DCA$_1$ 106 or DCA$_2$ 130 is asserted, either the output 146 of gate 142 or the output 148 of gate 144 is high. Thus, either SA 10a or SA 10c coupled to I/O$_1$ BUS 12 by means of MOSFET pairs 16a and 16b or 16e and 16f, respectively. PCAS2* 90 being low further causes the output 150 of inverter 152 to be high, which high is delayed by element 154 before appearing on line 156 to enable switch 158 to latch I/O$_1$ SA 20. The high on line 158 is further delayed by element 160 before enabling switches 162 and 164 to couple I/O$_1$ SA 20 to the lines 126 and 128 of the DRAM data bus.

In accordance with the invention, the signal DBC 32 being deasserted, or low, causes the DRAM to be placed in the conventional single data bit per CAS cycle page mode of operation. DBC 32 being low disables NAND gate 34 and enables one input to each of the NAND gates 42, 44 and 46 via inverters 52 and 54. The other input to NAND gate 42 is the output 166 of inverter 68, which output 66 is in phase with CAS* 40. Thus, both the outputs 66 and 76 are made to be in phase with one another and 180 degrees out of phase with CAS* 40.

As has been previously mentioned, MSCA 168 is utilized in the single bit mode to select either the I/O$_1$ BUS 12 or the I/O$_2$ BUS 14 to be coupled to the lines 126 and 128 of the DRAM data bus. MSCA 168 is applied as an input to gate 44 and the inversion of MSCA 168 is applied to gate 146 via inverter 170.

In operation, when CAS* 40 and RSAL* 88 are both asserted during a DRAM access, and DBC 32 is low thereby selecting the single bit mode, the state of MSCA 168 determines whether PCAS1* 92 or PCAS2* 90 will be asserted. If MSCA 168 is high the output 94 of gate 44 will be low, thereby causing the output of gate 80 (PCAS1* 92) to be deasserted. MSCA 168 being high further causes the output 82 of gate 46 to be high, due to inverter 170. Output 82 being high enables gate 78, thereby causing PCAS2* to be asserted. Alternately, MSCA 168 being low causes PCAS1* 92 to be asserted and PCAS2* 90 to be deasserted. Thus, in the single bit mode of operation the state of MSCA 168 selects either I/O$_1$ BUS 12 or I/O$_2$ BUS 14 for coupling a selected SA 10 to the lines 126 and 128 of the DRAM data bus.

Referring now to FIG. 2 there is shown a timing diagram illustrative of the above described operation of the circuitry of FIG. 1.

In FIG. 2 there is shown generally as A the conventional single bit output page mode cycle (DBC 32 low) and, generally as B, the dual bit output page mode cycle (DBC 32 high).

As can be seen, the A cycle is initiated by the assertion of RAS* 178, followed by the assertion of CAS* 40, as indicated by 182a. MSCA 168 is shown as high during the assertions 182a and 182b of CAS* 40, and low during the assertion 182c, thereby causing PCAS2* 90 to be asserted twice and PCAS1* 92 to be asserted once. Assuming that DCA$_1$ 106 (FIG. 1) is asserted during the cycle A the output 146 will be asserted twice in response to the assertions of PCAS2* 90. Each such assertion of output 146, as indicated by 184a and 184b, causes SA 10c to be coupled to the I/O BUS 12 via switches 16e and 16f. The subsequent assertion 186 of output 108 in response to the assertion of PCAS1* 92 causes SA 10d to be coupled to the I/O BUS 14 via switches 16g and 16h. Thus, three bits of data may be read from or written to the DRAM storage array, one bit for each assertion of CAS* 40.

The B cycle is initiated in part by the assertion of RAS* 178 and the assertion 190 of DBC 32. Inasmuch as the assertion of DBC 32 results in the disabling of gates 44 and 46 via inverter 54 (FIG. 1), the state of MSCA 168 during the B cycle is immaterial. The subsequent assertion 192a of CAS* 40 results in the assertion of PCAS1* 92 and the assertion 196a of output 108. The deassertion 194a of CAS* 40 results in the deassertion of PCAS1* 92 and the assertion of PCAS2* 90, which further results in the assertion 198a of output 146.

As can be seen, for each successive assertion (192b, 192c) of CAS* 40, the output 108 is asserted (196b, 196c). Similarly, for each successive deassertion (194b, 194c) of CAS* 40, the output 146 is asserted (198b, 198c). Thus, a total of six bits of data may be written to or read from the storage array, resulting in a data transfer rate which is twice as great as the transfer rate of cycle A, as described above.

It may be appreciated that the use of the invention confers several distinct advantages upon a DRAM. Firstly, the data access rate in the page mode of operation may be doubled, as has been previously mentioned.

Secondly, such a DRAM may be tested twice as rapidly as a DRAM having conventional single bit per CAS cycle page mode, resulting in substantial time and money savings in a high production environment. Thirdly, the ability to select between conventional and dual bit page modes of operation allows such a DRAM to be utilized in a variety of applications without the requirement of performing expensive retrofitting or circuit modifications.

The use of the invention is especially advantageous in a DRAM fabricated with complementary metal oxide semiconductor (CMOS) technology, wherein the address buffers and column decoder circuits are constructed using CMOS static circuits to realize fast circuit speeds and low power consumption. The use of the invention is, however, not limited to DRAMS constructed with CMOS circuitry, but may be advantageously employed in DRAMS fabricated with N channel MOS (NMOS) and other technologies.

In addition, the invention may be advantageously employed in any type of semiconductor memory wherein a precharge means is required to periodically precharge a portion of the memory circuitry or buses. For example, in a static random access memory (SRAM) wherein precharging of circuits is required, the inclusion of an additional bus or buses, control circuitry and precharge means allows for the active use of the device during the period of time which would, in a device of the prior art, be devoted to precharging.

In addition, within a DRAM there are other circuits which require precharging, such as the row address bus when the device is used in a row access mode. The use of the invention similarly allows for increasing the data access rate by providing an additional row address bus and precharge means therefore. It may also be realized that a DRAM which is internally partitioned into a plurality of storage blocks may make use of the invention by performing a partial device selection whereby one or more blocks may be precharged while another block is actively transferring data. Such a partitioned device would thereby be accessible at all times inasmuch as a periodic, total device refresh cycle would not be required.

It should be realized that the embodiment of the invention shown in FIG. 1 and described herein is illustrative only, and that a variety of equivalent circuit types and configurations may occur to those skilled in the art. Accordingly, this invention is not to be limited to the embodiment disclosed herein, but is to be limited only as defined by the appended claims.

Having thus described our invention, what we claim as new, and desire to secure by Letters Patent is:

1. A semiconductor memory device comprising circuitry operable for the storage and retrieval of data within said device, said device further comprising precharge means operable for periodically precharging at least a portion of said circuitry to a voltage potential, said circuitry being precharged being inoperable for the storage or retrieval of data therein during said precharging; said device further comprising:
    additional circuitry similarly operable for the storage and retrieval of data within said device;
    additional precharge means operable for periodically precharging said additional circuitry to the voltage potential; and
    control means responsive to one or more input control signals for selectively activating either said circuitry or said additional circuitry for storing and retrieving data while substantially simultaneously selectively activating the other one of said precharge means whereby the circuitry not activated for storing and retrieving data is precharged and whereby said device is provided at substantially all times with circuitry which is operable for the storage and retrieval of data.

2. A dynamic random access memory (DRAM) comprising:
    a first input/output I/O bus coupling a first plurality of bit line sense amplifiers to a first I/O sense amplifier;
    a second I/O bus coupling a second plurality of bit line sense amplifiers to a second I/O sense amplifier;
    first precharge means for precharging said first I/O bus to a voltage potential;
    second precharge means for precharging said second I/O bus to said voltage potential; and
    control circuit means operable for enabling an individual one of said first or said second plurality of bit line sense amplifiers and a corresponding one of said first or said second I/O sense amplifiers, said circuit means simultaneously enabling the other one of said precharge means to precharge said associated bus.

3. The DRAM of claim 2 wherein said control circuit means is responsive to the states of at least a mode control signal, a column address strobe signal, a decoded column address signal and an address signal to enable said bit line sense amplifier, said I/O sense amplifier and said precharge means.

4. The DRAM of claim 2 wherein said control circuit means is responsive to the states of at least a mode control signal, a column address strobe signal and a decoded column address signal to enable said bit line sense amplifier, said I/O sense amplifier and said precharge means.

5. A dynamic random access memory (DRAM) responsive to a successive assertion and deassertion of a column address strobe signal for performing a page mode type of data transfer between a selected cell within a data storage array and a data bus, said DRAM comprising:
    a first input/output (I/O) bus operable for coupling a first plurality of bit line sense amplifiers to a first input/output sense amplifier, each of said first plurality of bit line sense amplifiers being operatively coupled to a column of said cells, each of said bit line sense amplifiers further being couplable to said first I/O bust by an individual one of a first plurality of switching means;
    a second I/O bus operable for coupling a second plurality of bit line sense amplifiers to a second I/O sense amplifier, each of said second plurality of bit line sense amplifiers being operatively coupled to a column of said cells, each of said bit line sense amplifiers further being couplable to said second I/O bus by an individual one of a second plurality of switching means;
    first precharge means coupled to said first I/O bus for precharging said first I/O bus;
    second precharge means coupled to said second I/O bus for precharging said second I/O bus; and
    circuit means responsive to the state of each of at least a mode control signal, an address signal, and said column address strobe signal for selectively activating substantially simultaneously with one another either said first or said second precharge means, one of said switching means, and either said first or said second I/O sense amplifiers whereby one of said selected cells within said storage array is coupled to said data bus and whereby one of said first or said second I/O buses is precharged.

6. The DRAM of claim 5 wherein said circuit means has a first output state operable for selectively activating substantially simultaneously with one another said first I/O sense amplifier, one of said first plurality of switching means, and said second precharge means whereby said second I/O bus is precharged while said first I/O bus couples the selected one of said storage cells to said data bus; and wherein said circuit means has a second output state for selectively activating substantially simultaneously with one another said second I/O sense amplifier, one of said second plurality of switching means, and said first precharge means whereby said first I/O bus is precharged while said second I/O bus couples the selected one of said storage cells to said data bus.

7. The DRAM of claim 6 wherein said circuit means is responsive to a first state of said mode control signal and an assertion of said column address strobe signal whereby the state of said address signal is determinative of whether said circuit means has said first output state or said second output state, said circuit means having said first or said second output state only during a time when said column address strobe signal is asserted.

8. The DRAM of claim 6 wherein said circuit means is responsive to a second state of said mode control signal whereby an assertion of said column address strobe signal causes said circuit means to have said first output state and, further, whereby a deassertion of said column address strobe signal causes said circuit means to have said second output state.

9. In a dynamic random access memory comprising an array of storage cells for storing data therein, said array having column bit lines associated therewith and bit line sense amplifiers coupled to said bit lines, said memory further comprising a first input/output (I/O) bus for coupling said bit line sense amplifiers to a first I/O sense amplifier, said first I/O sense amplifier further being coupled to a data bus whereby data may be transferred to or from said data bus and said storage cells, said memory further being comprised of a first I/O bus precharge means for precharging said first I/O bus in order that said first I/O bus is operable for transferring said data, the improvement comprising:

a second I/O bus coupled to said bit line sense amplifiers whereby equal numbers of said bit line sense amplifiers are coupled to each of said first and said second I/O buses;

a second I/O bus sense amplifier for coupling said second I/O bus to said data bus;

a second I/O bus precharge means for precharging said second I/O bus in order that said second I/O bus is operable for transferring data; and control circuit means responsive to a control input for determining which of said first or said second I/O buses is to transfer data while simultaneously causing the precharging of the other one of said I/O buses.

10. A method of increasing the data transfer rate of a dynamic random access memory comprising the steps of:

providing a first input/output (I/O) bus for coupling a first plurality of bit line sense amplifiers to a first I/O sense amplifier;

providing a second I/O bus for coupling a second plurality of bit line sense amplifiers to a second I/O sense amplifier;

providing a first and a second precharge means for precharging the first and the second I/O buses, respectively; and controlling the enabling of an individual one of the first or the second plurality of bit line sense amplifiers and a corresponding one of the first or the second I/O sense amplifiers while simultaneously controlling the enabling of the other one of the precharge means whereby an increased data transfer rate is achieved by substantially continuously providing for use one of the I/O buses.

11. The method of claim 10 wherein the step of controlling is accomplished by enabling the individual one of the first plurality of bit line sense amplifiers and the first I/O sense amplifier for transferring data while simultaneously precharging the second I/O bus during the time that a column address strobe signal is asserted and further, by enabling the individual one of the second plurality of bit line amplifiers and the second I/O sense amplifier for transferring data while simultaneously precharging the first I/O bus during the time that the column address strobe signal is deasserted.

* * * * *